United States Patent [19]

Opdyke

[11] Patent Number: 5,359,173

[45] Date of Patent: Oct. 25, 1994

[54] SCANNING TECHNIQUE FOR LASER ABLATION

[75] Inventor: Kenneth L. Opdyke, Fairport, N.Y.

[73] Assignee: Bausch & Lomb Incorporated, Rochester, N.Y.

[21] Appl. No.: 80,885

[22] Filed: Jun. 22, 1993

Related U.S. Application Data

[63] Continuation-in-part of Ser. No. 953,607, Sep. 29, 1992, abandoned.

[51] Int. Cl.⁵ .............................. B23K 26/00
[52] U.S. Cl. .................... 219/121.69; 219/121.8; 264/22
[58] Field of Search .......... 219/121.68, 121.69, 219/121.8; 156/642; 430/945, 322; 264/22, 25

[56] References Cited

U.S. PATENT DOCUMENTS

| | | | |
|---|---|---|---|
| 4,417,948 | 11/1983 | Mayne-Banton | 156/643 |
| 4,455,893 | 6/1984 | Asterö219 | 121.8/ |
| 4,563,565 | 1/1986 | Kampfer et al. | 219/121.69 |
| 4,568,632 | 2/1986 | Blum | 430/322 |
| 4,965,430 | 10/1990 | Curtis et al. | 219/121.69 |
| 5,061,342 | 10/1991 | Jones | 156/643 |
| 5,170,191 | 12/1992 | Jones | 351/160 |
| 5,240,553 | 8/1993 | Jones | 156/643 |
| 5,256,853 | 10/1993 | McIntyre | 219/121.75 |

FOREIGN PATENT DOCUMENTS

| | | |
|---|---|---|
| 16145/88 | 5/1988 | Australia . |
| 0366356 | 5/1990 | European Pat. Off. . |
| 0407969 | 1/1991 | European Pat. Off. . |
| 0457612 | 11/1991 | European Pat. Off. . |
| 8908529 | 9/1989 | PCT Int'l Appl. . |
| 9302830 | 2/1993 | PCT Int'l Appl. . |

OTHER PUBLICATIONS

U.S. Ser. No. 07/783293, Oct. 28, 1991, Jones.
U.S. Ser. No. 07/921193, Jul. 28, 1992, Lunney.
U.S. Ser. No. 07/954858, Sep. 29, 1992, Chan.
U.S. Ser. No. 07/953399, Sep. 29, 1992, Opdyke.
U.S. Ser. No. 07/953607, Sep. 29, 1992, Opdyke.
U.S. Ser. No. 07/953408, Sep. 29, 1992, Chan.

*Primary Examiner*—C. L. Albritton
*Attorney, Agent, or Firm*—David M. Krasnow; Craig E. Larson

[57] ABSTRACT

Improved methods of modifying target surfaces through ablation are disclosed resulting in a reduction of debris redeposition on the target surface.

19 Claims, 5 Drawing Sheets

SCANNING TECHNIQUE FOR LASER ABLATION

This is a continuation-in-part application of copending U.S. Ser. No. 07/953,607 filed Sep. 29, 1992, now abandoned.

FIELD OF THE INVENTION

The present invention relates to the field of laser modification of target surfaces through ablation and methods for smoothing surfaces using lasers, as well as targets modified by such ablative techniques.

BACKGROUND OF THE INVENTION

The use of laser beams to modify surfaces is known. In the early 1980's, it was discovered that pulsed lasers emitting in the ultraviolet frequency range could affect a target surface through ablative photodecomposition (APD). Later it was found that by using APD, layers of target material could be removed on the order of about one micron of target material per pulse.

It was further noted that APD did not significantly alter the characteristics of the newly exposed material immediately below the ablated material. This phenomenon has been explained as being due to the UV lasher providing enough energy in a short enough period of time to actually break the covalent bonds of the polymeric target materials without heating the substrate. (See U.S. Pat. Nos. 4,417,948 and 4,568,632). Further scanning techniques using APD are disclosed in U.S. Pat. No. 5,061,342.

Upon further investigation, it was found that certain materials, when ablated, created varying amounts of ablation debris, some of which was redeposited upon the surface of the target material. It was believed that this redeposited debris could frustrate efforts to predictably alter the ablated target surface.

Further, it was found that certain materials could not be as cleanly etched as others. A method for ablating a target surface while also removing the deposited and adhered debris from the target surface while avoiding further debris accumulation is not known.

SUMMARY OF THE INVENTION

A novel method for ablating surfaces in a way that simultaneously clears away deposited debris and avoids subsequent debris accumulation has now been determined. To obtain a desired resulting surface on a selected target, the debris formed during the ablation process which becomes redeposited at, and adheres to the target surface must be removed from the target surface before the ablation process continues over the remainder of the target surface.

In accordance with the present invention, a method is disclosed for photoablating a target surface comprising the steps of: a) directing a beam of pulsed UV radiation at a predetermined initial scanning area on the target surface; b) scanning said beam in a direction away from said predetermined initial scanning area to a first edge of the target surface; c) rotating the target in increments; d) returning the beam to said predetermined initial scanning area on the target surface; e) scanning the beam in a direction away from said predetermined initial scanning area to the edge opposing said first edge of said target surface; and repeating steps c), d) and e) in sequence such that the entire target surface is scanned.

In further accordance with the present invention, a method is disclosed for photoablating a target surface comprising the steps of: a) directing a beam of pulsed UV radiation at a predetermined initial scanning area on the target surface; b) scanning said beam in a direction away from said predetermined initial scanning area to a first edge of the target surface; c) rotating the target 180 degrees; d) returning the beam to said predetermined initial scanning area on the target surface; and e) scanning the beam in a direction away from said predetermined initial scanning area to the edge opposing said first edge of said target surface such that the entire target surface is scanned.

It is further thought that the invention of the present application is especially useful for profiling, crosslinked, thermoset, thermoplastic or other materials including optically clear materials suitable for use as contact lenses.

DETAILED DESCRIPTION OF THE DRAWINGS

Figure 1:
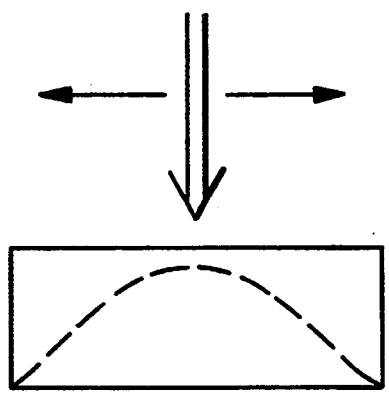
FIG. 1 depicts a cross-sectional view of a contact lens blank. The dotted line is an exaggeration of the desired final toric surface.

As shown in FIG. 1, a toric curve can be placed on a target contact lens blank by removing more material at the periphery of the optical zone. It is understood to the skilled practitioner in the field that surfaces of any configuration can be produced using the present invention and that the figures presented are for illustrative purposes only.

Figure 2:
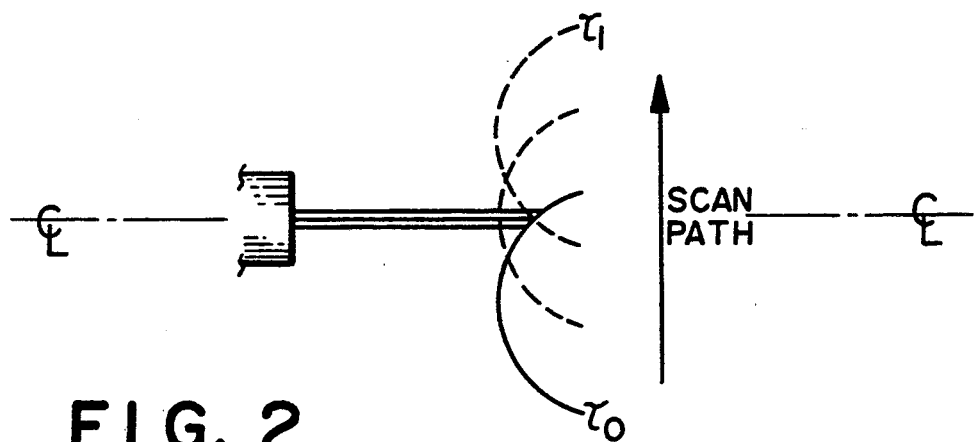
FIG. 2 is a schematic diagram depicting a conventional scanning technique (edge-to-edge or EE) for comparative purposes.

FIG. 2 shows the laser beam scanning a contact lens surface using an edge-to-edge (EE) technique whereby the laser is fixed and its beam is directed first at one edge of the target surface at position $t_0$. A stage holding the target surface is then moved across the path of the beam until the beam reaches the opposing edge and the stage is at its final position, $t_1$, thereby scanning the entire target surface.

Figure 3:
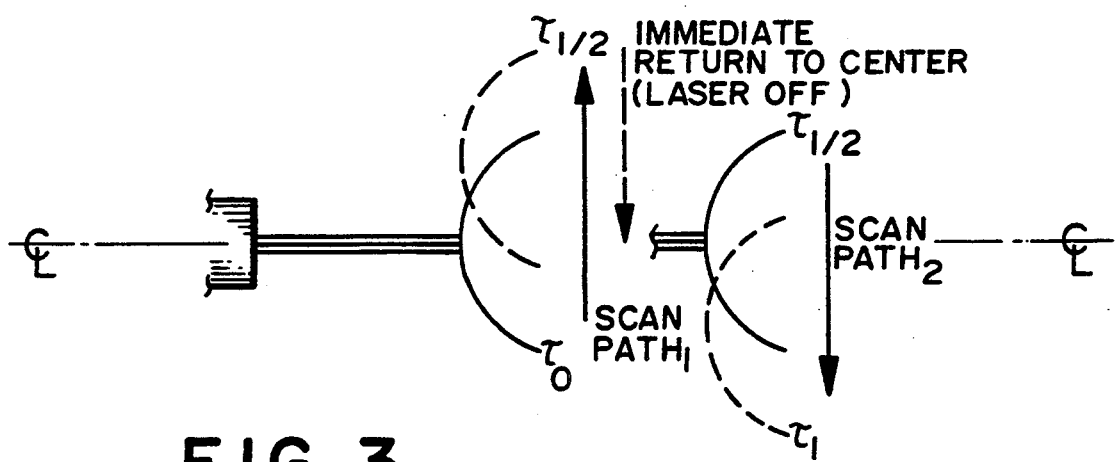
FIG. 3 is a schematic diagram depicting the novel center-to edge (CE) scanning technique.

In accordance with one embodiment of the present invention, FIG. 3 shows the laser beam in a fixed position having its beam directed at the bisecting line of the lens. The stage holding the lens is then moved such that the laser scans the surface of the target from the bisecting line toward a first edge. The stage therefore travels from its initial position, $t_0$ to the position $t^1$. The stage to which the lens is affixed is then returned to its original position, $t_0$. The beam is then once again activated at the bisecting line of the lens, and the stage is moved from the position $t_0$ to position $t_1$ such that the beam is scanned across the remaining target surface to the edge opposing said first edge such that the entire target surface has been scanned.

It is understood that the stage may be held fixed and the beam moved across the target surface. It is further understood that in a preferred embodiment after the stage is moved to position $t_1$, the stage is returned to position $t_0$, rotated 180 degrees, and then scanned again to position $t_1$ thereby scanning the entire target surface.

Figure 4:
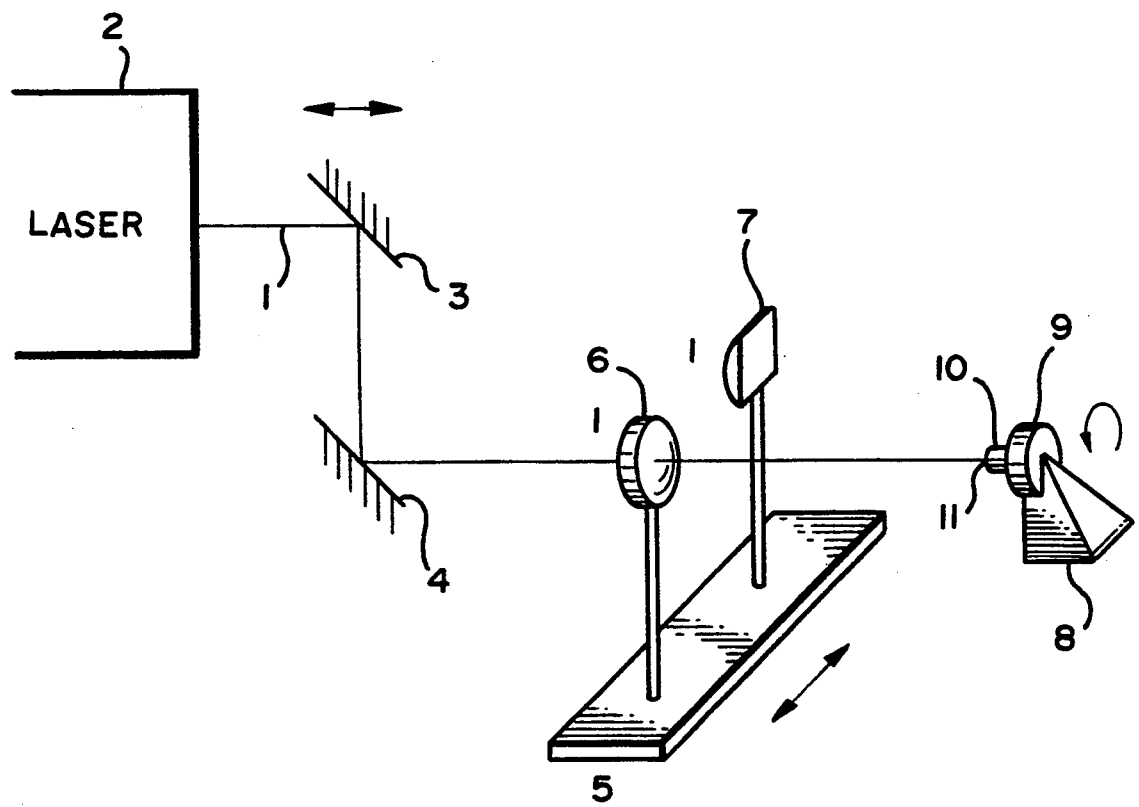
FIG. 4 is a diagram depicting a representative experimental set up for the CE scanning technique

FIG. 4 depicts one preferred set-up for employing the present invention. The raw laser beam (1) is emitted from an excimer laser (2). The raw beam is directed to a first scanning mirror (3) and may be directed to a second scanning mirror (4). The raw beam is then directed to a movable beam modification stage (5) which may comprise a focussing lens (6) which produces high fluence. The bear, modification station may also comprise a cylindrical lens (7) for producing beams of low fluence. After the beam has been modified, it is directed to the target station (8). The target station comprises a rotatable means (9) to which is attached a mounting means (10) to hold the target (11) in place.

Figure 5:
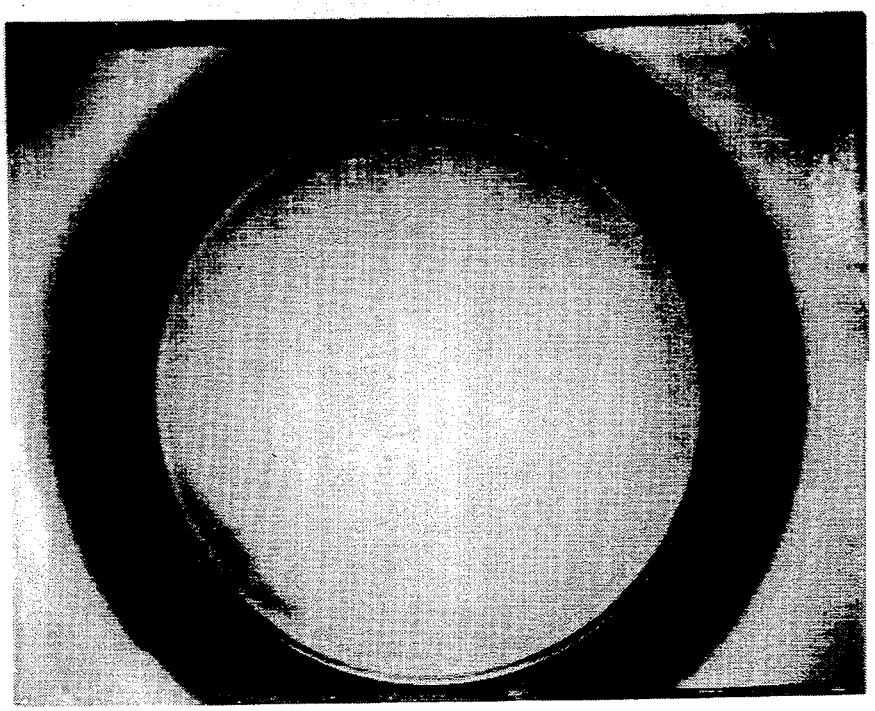
FIG. 5 is a photograph depicting the unetched surface of Ultem TM for comparative purposes.
Figure 6:
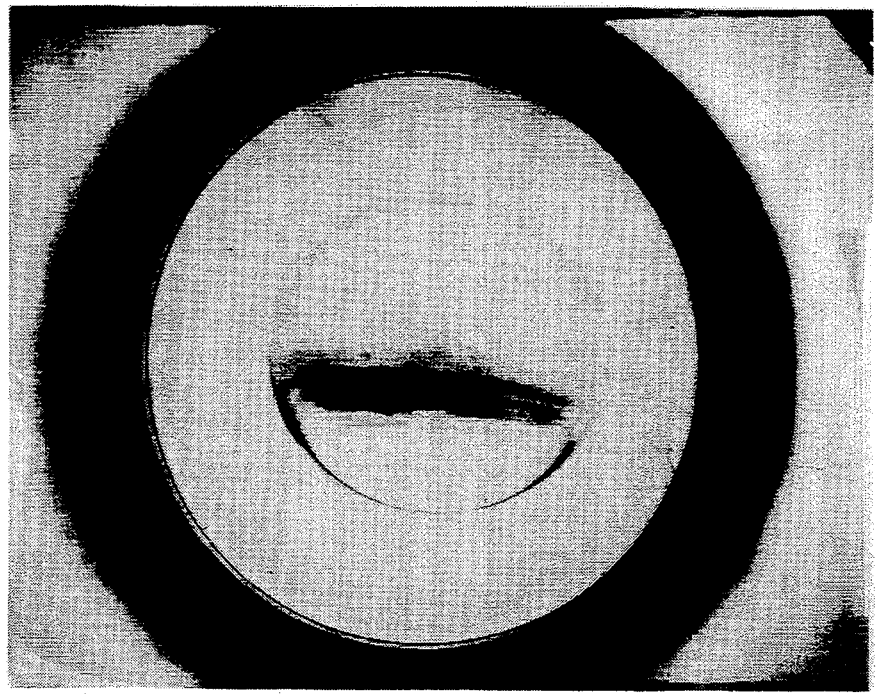
FIG. 6 is a photograph showing the surface of an Ultem TM (General Electric, Pittsfield, Mass.) target etched using the EE technique.

In FIGS. 5 and 6, it can be plainly seen that a conventional EE scan has left debris visible at 45× magnification on the surface. However, it can be plainly seen from the photograph in FIG. 7 that, with no alteration in the system set-up other that employing the center-to-edge (CE) technique, use of such CE technique has left a visibly cleaner surface with no ablation debris.

Figure 7:
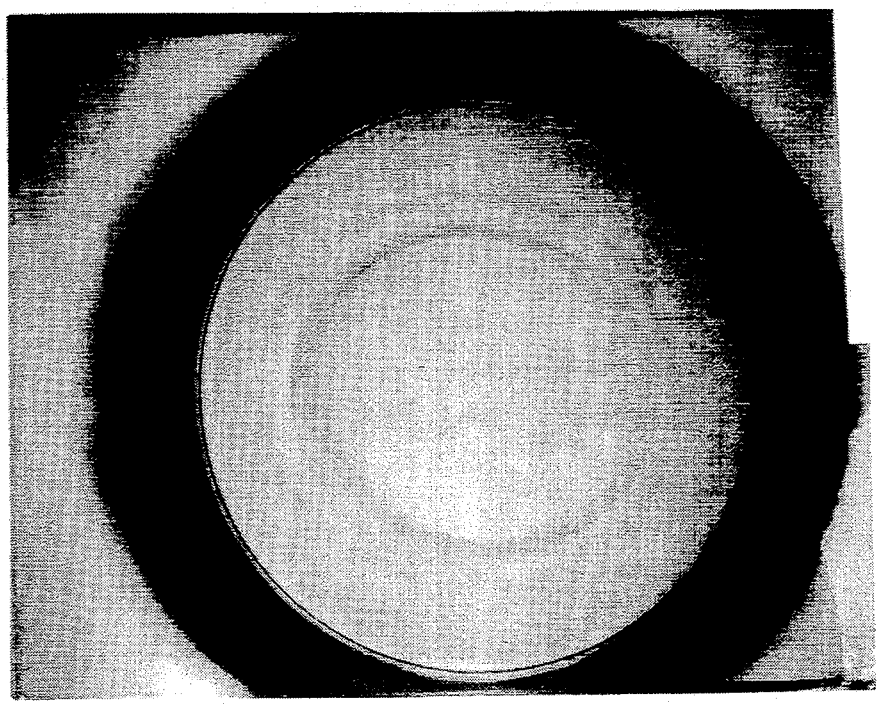
FIG. 7 is a photograph showing the surface of an Ultem TM (General Electric, Pittsfield, Mass.) target etched using the CE technique.

The results shown in FIG. 7 are remarkable since difficulty had been previously encountered attempting to ablate various thermoplastic compounds such as Ultem TM (General Electric, Pittsfield, Mass.) and Radel TM (Amoco, Atlanta, Ga.). As shown in these photos, the Ultem TM surface has been cleanly ablated with no visible debris at 45× magnification using the CE technique described herein. FIG. 6 shows the significant ablation debris which remains after a conventional EE scan of the Ultem TM surface.

DETAILED DESCRIPTION OF THE INVENTION

The present invention relates to a new method of modifying optical surfaces to produce changes in their spherical, cylindrical or other refractive power, shape factor or other surface geometry. This new method is a modification of the procedures taught in U.S. Pat. No. 5,061,342, the entire content of which is incorporated by reference herein.

The method of the present invention employs UV radiation to ablate material from a target surface in order to produce a desired final surface on the target. Suitable target surfaces to be ablated include contact lenses, contact lens blanks, molds used to make contact lenses, tools used to make such molds, and any means which either directly or indirectly imparts a desired predictable final spherical, cylindrical or other refractive power, shape factor or other surface geometry on an object, such as a contact lens.

Varying amounts of material must often be removed from a target surface to produce a desired end result. For example, to produce toric surfaces on a contact lens, more material must be removed from the edges or periphery than from the central region of the optical zone. (See FIG. 1). Therefore, to produce the toric surface, a significant amount of ablated debris is created at the periphery of the optical zone, as compared to the debris created when the central region of the optical zone is scanned and its surface ablated.

Toric contact lenses are understood to be lenses which correct the insufficient visual acuity caused by astigmatism. Such lenses have a cylindric component of refraction, which refractivity is not constant in all planes passing through the optical axis, but has a maximum refractivity in one plane and a minimum refractivity in another plane perpendicular to the first plane.

It was discovered that when the laser beam begins its scan on a lens to produce a toric surface, significant ablated debris was randomly redeposited on the surface of the lens. Some of the debris was redeposited on the lens target in the path of the laser beam scan. When this occurred, as the laser continued its scan, the first material encountered by the beam was not the original target surface, but was the redeposited and freshly adhered debris from the periphery.

While the final surfaces created from the so called "edge-to-edge" (EE) scans described in U.S. Pat. No. 5,061,342 were often an improvement over other known surface modification procedures, such as lathing, et al., it was believed that the debris which was sometimes created, hindered the best results possible.

Therefore, as contemplated by the present invention, the beam is initially located at a predetermined initial scanning area, for example a bisecting line of the lens, and scanned toward a first edge of the lens. When the beam reaches the first edge, in one preferred embodiment, the scan is terminated and the beam returned to the predetermined initial scanning position. The stage to which the lens or other target is affixed is then preferably rotated 180 degrees such that the beam may travel in the same direction as it traveled to scan the first "half" of the target. At this point the beam once again is activated and the scan proceeds to move toward the edge opposing the first edge, this time scanning over the remainder of the target surface. In this way more of the debris seems to be effectively "swept" progressively forward and away from the optical zone and does not appear to interfere with the desired final surface.

It is understood that a bisecting line on the target surface is a line extending across the center of the target surface. (The target surface need not be circular or spherical in shape.)

Therefore, to achieve the improved ablation results in accordance with this invention, the beam may be scanned in a direction proceeding from "center-to-edge" or from "edge-to-center" depending only upon what final results are desired in view of the condition of the initial target surface. In other words, the amount of material to be removed at any given point from the target surface determines where the beam scan will begin and end.

It is therefore believed that to reduce debris accumulation on the target surface, the beam scan must begin at a point on the target surface where the least amount of material is to be removed and the least amount of debris will be formed. It will therefore, be understood by the skilled practitioner in the art, that the scans may begin and end in any variety of positions imaginable to create any finished surface effect desired, from any shaped original target surface.

Further, the predetermined initial scanning area may be the bisecting line of the target, or may be a line or area which is between the bisecting line and an edge of the target surface. Therefore it is contemplated that the present invention can be used to make spherical and aspherical lenses including but not limited to toric, bifocal and multifocal lenses. What is required, is that the beam be scanned from an initial scanning area to one edge, followed by at least one subsequent scan from the initial scanning area in a direction outward to a second edge, etc. in a fashion such that the entire target surface is eventually scanned. Therefore, it is contemplated that the present invention can be used to make standard and a spherical lense including but not limited to toric, bifocal, or multiple focal lenses.

For example, the stage may be rotated to any degree and scanned in repeated increments such as, for example, every 20 degrees, until the entire target surface has been scanned. In the case of modifying the surface of contact lenses, the target surface is generally the optical zone which is about as wide as the raw beam generated by the excimer laser.

Therefore, the scan of the entire target surface can be effected by rotating the stage 180 degrees and making one scan (or two CE scans) across the optical zone. However, the beam could be modified, as will be readily apparent to those skilled in the art, to be so narrow as to require rotating the target, for example, in 20 degree increments following each scan from the bisecting line to the target edge.

It is understood that after scanning from the center to one edge in one direction, that the inactivated beam could then be returned to the center and then made to scan in the opposite direction toward the edge opposite the edge toward which the beam initially scanned. In this way the entire target surface is scanned but the stage holding the target is not rotated or indeed moved at all. This embodiment would be important if the target being scanned could not be conveniently or accurately rotated, such as a supine patient having corneal surgery.

The laser energy applied to a target per unit area is known as the fluence, which for UV radiation is often expressed in terms of millijoules per square centimeter ($mJ/cm^2$). The fluence range of the laser scanned in accordance with the present invention is preferably from about 20 to about 5000 $mJ/cm^2$, is more preferably from about 500 to about 2000 $mJ/cm^2$, and is most preferably from about 750 to about 1500 $mJ/cm^2$.

While the method of the present invention will work at any given energy level it is understood by those skilled in the field that certain materials will require a certain fluence to effectively affect surface characteristics through ablation.

A "crosslinked" polymeric material is understood to describe any polymeric material which has any attachment of two chains of its polymer molecules by bridges comprised of either an element, a group, or compounds known as crosslinking agents.

The term "thermoset" refers to polymeric material which solidifies or "sets" irreversibly when heated. By contrast, a "thermoplastic" material is understood to refer to a polymer which softens when exposed to heat and is able to return to its original condition.

While the present invention is well suited for the modification of contact lenses, the modification of contact lens buttons, blanks and molds, as well as the tools used to make the molds and the contact lenses is also contemplated by the present invention. Indeed any means for imparting optical properties or surface geometries may be modified by the present invention. The surface modification through laser scanning of such tools used to make the molds which, in turn, are used to make contact lenses in a cast molding procedure is disclosed in a concurrently filed and commonly assigned U.S. Ser. No. 07/953,425.

The present invention is further thought to be useful for other laser scanning applications such as corneal sculpting as well as any other procedures where ablation debris has been noted as an obstacle to achieving better target surface quality after scanning.

The following examples serve only to further illustrate aspects of the present invention and should not be construed as limiting the invention.

EXAMPLES 1-5

Toric Surfaces on Ultem TM

Samples of Ultem TM were ablated using the scanning technique disclosed in U.S. Pat. No. 5,061,342 at a rate of about 140 pulses per sample. The standard fluence used was about 940 $mJ/cm^2$.

The samples were all inspected preliminarily with the unaided eye for transmission and reflection with observations recorded. In each case the samples were cleaned with Axarel TM (DuPont, Wilmington, Del.) although any suitable cleaning agent may be used as will be apparent to the skilled practitioner in the field. Photographs were then taken of the samples followed by curve inspections using a ZYGO Mark IV Interferometer.

Further definitions are presented below: EE Scan—'-'Edge-to-edge"—single scan across target beginning at one edge of the optical zone and continuing across target to the other edge of the optical zone.

CE Scan—"Center-to-edge"—Single scan beginning at center of optical zone and continuing across to one edge of optical zone. The target is then rotated 180 degrees, the beam is returned to its starting position and repeats the scan.

EXAMPLE 1

Edge-to-Edge scan samples of flat Ultem were scanned using a standard scanning profile for approximately 140 pulses.

The results of the EE scan are shown at FIG. 6. Dark bands perpendicular to the scan occurred near the beginning of the scan. The bands were easily visible to the unaided eye in transmission and reflection. After cleaning with Axarel the black ring was completely removed, the dark band reduced but still evident.

EXAMPLE 2

The results of the CE scan are shown at FIG. 7. Slightly dark band occurred on the first scan side. The band was easier to view in reflection. After cleaning with Axarel the black ring was gone, the dark band was only slightly visible in transmission but not at all visible in reflection.

While the previous samples used in the examples were all flat, the experiments were repeated for convex and concave samples with essentially the same results.

EXAMPLE 3

Roughness Comparison

Two flat Ultem samples were modified, one by CE and one by EE scanning techniques. The resulting samples were analyzed by Talysurf surface profilometer, The following definitions were used:
Sample 1—EE Scan
Sample 2—CE Scan
Full Zone—The entire etched area
Zone 1—Left of Center (Etched last on EE)
Zone 2—Right of Center (Etched first on EE)

| Sample | Zone | Roughness* (Avg.) | Improvement |
|---|---|---|---|
| 1 | Full | 0.1378 | — |
| 2 | Full | 0.0774 | 44% |
| 1 | 1 | 0.0614 | — |
| 2 | 1 | 0.0289 | 53% |
| 1 | 2 | 0.1152 | — |
| 2 | 2 | 0.0351 | 70% |

This data confirms a significant reduction in average surface roughness using the CE technique.

Many other modifications and variations of the present invention are possible to the skilled practitioner in the field in light of the teachings herein. It is therefore understood that, within the scope of the claims, the present invention can be practiced other than as herein specifically described.

I claim:

1. A method for photoablating a target surface comprising the steps of: a) directing a beam of pulsed UV radiation at a predetermined initial scanning area on the target surface; b) scanning said beam in a direction away from said predetermined initial scanning area to a first edge of the target surface; c) rotating the target in increments; d) returning the beam to said predetermined initial scanning area on the target surface; e) scanning the beam in a direction away from said predetermined initial scanning area to the edge opposing said first edge of said target surface; and repeating steps c), d) and e) in sequence such that the entire target surface is scanned.

2. A method for photoablating a target surface comprising the steps of: a) directing a beam of pulsed UV radiation at a predetermined initial scanning area of the target surface; b) scanning said beam in a direction away from said predetermined initial scanning area to a first edge of the target surface; c) rotating the target 180 degrees; d) returning the beam to said predetermined initial scanning area of the target surface; and e) scanning the beam in a direction away from said predetermined initial scanning area to the edge opposing said first edge of said target surface, such that the entire target surface is scanned.

3. The method of claim 2 wherein said beam of pulsed UV radiation is emitted from an excimer laser.

4. The method of claim 2 wherein said target surface is comprised of a crosslinked polymeric material.

5. The method of claim 2 wherein said target surface is a thermoset material.

6. The method of claim 2 wherein said target surface is a thermoplastic material.

7. The method of claim 2 wherein the fluence of said beam of pulsed UV radiation is from about 20 mJ/cm$^2$ to about 5000 mJ/cm$^2$.

8. The method of claim 2 wherein the fluence of said beam is about 1 J/cm$^2$.

9. The method of claim 2 wherein said predetermined initial scanning area is a bisecting line.

10. The method of claim 2 wherein said target is a contact lens.

11. A method for photoablating a target surface comprising the steps of: a) directing a beam of pulsed UV radiation at a predetermined initial scanning area of the target surface; b) scanning said beam in a direction away from said predetermined initial scanning area to a first edge of the target surface; c) inactivating said beam; d) returning the beam to the predetermined initial scanning area; e) reactivating said beam; and f) scanning said beam in the direction directly opposite the scan made in step b) such that the entire target surface is scanned.

12. A modified target surface prepared by ablative photodecomposition comprising the steps of: a) directing a beam of pulsed UV radiation at a predetermined initial scanning area of the target surface; b) scanning said beam in a direction away from said predetermined initial scanning area to the edge of the target surface; c) rotating the target 180 degrees; d) returning the beam to the predetermined initial scanning area of the target surface; and e) scanning the beam in a direction away from said predetermined initial scanning area to the edge opposing the said first edge of said target surface, such that the entire target surface is scanned.

13. The target surface of claim 12 wherein said target surface is a means capable of imparting optical properties or surface geometries characteristics on a second surface.

14. The method of claim 12 wherein said target surface is a contact lens.

15. A corneal target surface modified by ablative photodecomposition comprising the steps of: a) directing a beam of pulsed UV radiation at a predetermined initial scanning area of the target surface; b) scanning said beam in a direction away from said predetermined initial scanning area to a first edge of the target surface; c) inactivating the beam; d) returning the beam to the predetermined initial scanning area of the target surface; and e) scanning the beam in a direction directly opposite from the direction of the scan in step b) from said predetermined initial scanning area to the edge opposing said first edge of said target surface, such that the entire target surface is scanned.

16. The method of claim 1 wherein said predetermined initial scanning area is a bisecting line.

17. The method of claim 11 wherein said predetermined initial scanning area is a bisecting line.

18. The modified target surface of claim 12 wherein said predetermined initial scanning area is a bisecting line.

19. The corneal surface of claim 15 wherein said predetermined initial scanning area is a bisecting line.

* * * * *